US007345480B2

(12) United States Patent
Pai et al.

(10) Patent No.: US 7,345,480 B2

(45) Date of Patent: Mar. 18, 2008

(54) METHOD, SYSTEM, STORAGE MEDIUM AND SOFTWARE ARRANGEMENT FOR RADIAL PRESCRIPTION OF LONG-AXIS SLICES IN MAGNETIC RESONANCE IMAGING EXAMINATIONS

(75) Inventors: Vinay Manjunath Pai, New York, NY (US); Leon Axel, Philadelphia, PA (US)

(73) Assignee: New York University, New York, NY (US)

( * ) Notice: Subject to any disclaimer, the term of this patent is extended or adjusted under 35 U.S.C. 154(b) by 11 days.

(21) Appl. No.: 10/579,506

(22) PCT Filed: Nov. 15, 2004

(86) PCT No.: PCT/US2004/038145

§ 371 (c)(1), (2), (4) Date: May 15, 2006

(87) PCT Pub. No.: WO2005/048816

PCT Pub. Date: Jun. 2, 2005

(65) Prior Publication Data

US 2007/0063703 A1 Mar. 22, 2007

Related U.S. Application Data

(60) Provisional application No. 60/520,080, filed on Nov. 14, 2003.

(51) Int. Cl.
*G01V 3/00* (2006.01)

(52) U.S. Cl. ....................................... 324/309; 324/307

(58) Field of Classification Search ................ 324/309, 324/307
See application file for complete search history.

(56) References Cited

U.S. PATENT DOCUMENTS 4,710,716 A 12/1987 Keren et al.
5,421,331 A 6/1995 Devito et al.
5,512,827 A 4/1996 Hardy et al.
5,584,293 A 12/1996 Darrow et al.
5,699,799 A 12/1997 Xu et al.
6,038,466 A 3/2000 Haselhoff

OTHER PUBLICATIONS

PCT International Preliminary Report on Patentability for International Application No. PCT/US2004/038145 dated Jun. 2, 2006.

*Primary Examiner*—Brij Shrivastav
*Assistant Examiner*—Megann E Vaughn
(74) *Attorney, Agent, or Firm*—Dorsey & Whitney LLP

(57) ABSTRACT

A method, system, and software arrangement for automatically prescribing long-axis magnetic resonance imaging ("MRI") slices of a target are provided. An MRI image is captured along a short-axis slice of the target. Vectorial components, including slice selection, phase-encoding, and frequency encoding vectors, are extracted from the short-axis slice. Vectorial components are established for a long-axis slice using the vectorial components of the short-axis slice, by transposing the slice-selection and frequency-encoding vectors. A plurality of long-axis slice planes are defined in a manner positioned relative to the long axis slice, rotating about a long axis in a direction of a long-axis frequency encoding vector. In one exemplary embodiment, frequency and phase shifts are established for each of the long-axis slices, for use in RF transmitting and receiving.

32 Claims, 5 Drawing Sheets

METHOD, SYSTEM, STORAGE MEDIUM AND SOFTWARE ARRANGEMENT FOR RADIAL PRESCRIPTION OF LONG-AXIS SLICES IN MAGNETIC RESONANCE IMAGING EXAMINATIONS

CROSS-REFERENCE TO RELATED APPLICATION

The present invention claims priority from U.S. Provisional Patent Application No. 60/520,080, filed Nov. 14, 2003, which is incorporated herein by reference in its entirety.

FIELD OF INVENTION

The present invention relates to magnetic resonance imaging. More particularly, the present invention relates to a method and system for obtaining magnetic resonance images at radial slices along a predefined long-axis of an imaging target.

BACKGROUND INFORMATION

In the field of cardiac magnetic resonance imaging ("MRI"), various types of studies utilize multiple images along different "slice" planes to analyze the target of the MRI. This is particularly true with cardiac MRI techniques that can be used to map cardiac regions, such as cardiac cine examinations, perfusion, delayed enhancement, magnetization tagging, etc. Images are taken of planes along both a long-axis and a short-axis of the heart. The "long axis" is a plane parallel to the longest dimension of a target anatomical structure. The "short axis" is a plane parallel to the shortest dimension of a target anatomical structure. Conventionally, in cardiac imaging, it is desirable to acquire images in the long-axis plane in a uniformly angularly-spaced radial fashion to encompass the region imaged in the short-axis slices. Also, the frequency-encoding direction of the long-axis slices are taken "down the barrel" of the heart, i.e., normal to the image plane of the short-axis images.

One limitation of existing systems and methods is their inability to easily prescribe slice planes for capturing multiple images along an axis. For example, quantitative and qualitative cardiac MRI studies utilizing magnetization tagging have become important components of the cardiac MRI examination. When performing quasi-3D tagging studies, conventional procedures obtain a number of tagged images in the short-axis plane of the heart, with two orthogonal sets of tags, and combine these with tagged images obtained in the long-axis plane of the heart. Conventional techniques manually prescribe the long-axis slices.

In conventional graphical slice prescription techniques, a user defines a slice-selection ("SS") direction, a phase encoding ("PE") direction and a readout (or "frequency encoding" "RO") direction are calculated based on the SS direction. RO is defined by the cross-product of the SS and PE directions, because the RO direction is normal to both the SS and PE directions. For example, let s, c and t represent sagittal, coronal, and transverse directions, respectively, and $\vec{P}_0:(P_s, P_c, P_t))$, $\vec{R}_0: (R_s, R_c, R_t)$ and $\vec{S}_0: (S_s, S_c, S_t)$ represent vectors in the PE, RO, and SS directions, respectively, for a first long-axis imaging slice. Using this representation, and depending on the orientation of $\vec{S}_0$, the PE vector can be provided as follows:

$$\vec{P}_0|_t=[0, S_t/K_{ct}, -S_c/K_{ct}]$$

$$\vec{P}_0|_c=[S_c/K_{sc}, -S_s/K_{sc}, 0]$$

$$\vec{P}_0|_s=[-S_c/K_{sc}, S_s/K_{sc}, 0],$$

where $K_{ij}=\sqrt{S_i^2+S_j^2}$ and the suffixes to $\vec{P}_0$ indicate the direction of the SS vector. $\vec{R}_0$ is then calculated by computing the vector cross-product, $\vec{R}_0=\vec{S}_0\times\vec{P}_0$.

Conventional systems and methods are limited in their capabilities to provide a simple approach to developing quick radial prescription of long-axis imaging slices. Conventional systems require their users to manually prescribe the long-axis planes needed to develop these radial prescriptions. An examination typically consists of 8-10 slices which should be uniformly angularly spaced. As a result, manual prescription of long-axis slices can be a tedious process, and prone to error.

OBJECTS AND SUMMARY OF THE INVENTION

There exists a need to provide an improved method and system for automatically prescribing long-axis magnetic resonance imaging ("MRI") MRI slices which overcomes at least some of the above-referenced deficiencies. Accordingly, at least this and other needs have been addressed by exemplary embodiments of the method and system for automatically prescribing long-axis MRI slices according to the present invention. One such exemplary embodiment is directed to a method of automatically prescribing radial slice planes for magnetic resonance imaging ("MRI") along a long-axis of a target. Vectorial components can be acquired for a short-axis imaging slice of the target. Vectorial components may be established for a first long-axis slice using the vectorial components of the short-axis slice. A plurality of long-axis slice planes can be defined in a manner positioned relative to the first long axis slice, rotating about a long axis in a direction of a long-axis frequency encoding vector.

In another exemplary embodiment of the present invention, an MRI apparatus is provided. The apparatus may include a processor that can be configured to execute instructions for performing a method of automatically prescribing radial along a long-axis of a target. The method provides vectorial components for a first long-axis slice of a target using vectorial components of a short-axis slice of the target. A plurality of long-axis slice planes may then be defined relative to the first long-axis slice, rotating about a long axis in a direction of a long-axis frequency encoding vector. A frequency shift can be calculated for the long-axis slices. The apparatus may further include an RF transmitter in communication with the processor. The transmitter can generate an RF pulse toward a target in response to a signal from the processor to capture an image at each of the plurality of long-axis slice planes. The apparatus may further include an RF receiver in communication with the processor, and the RF receiver can receive data from echoes created by the pulses and sends the data to the processor.

In yet another exemplary embodiment of the present invention, a tangible, computer-readable medium is provided. The medium has stored thereon computer-executable instructions for performing a method of automatically prescribing radial slice planes for magnetic resonance imaging ("MRI") along a long-axis of a target. The method can provide vectorial components for a first long-axis slice using vectorial components for each of a plurality of short-axis imaging slices of the target The method can further define a plurality of long-axis slice planes positioned relative to the first long axis slice. Each of the long-axis slices is positioned relative to a long axis, rotating about the long axis in a direction of a long-axis frequency encoding vector.

BRIEF DESCRIPTION OF DRAWINGS

The detailed description will refer to the following drawings, wherein like numerals refer to like elements, and wherein.

DETAILED DESCRIPTION

Figure 1:
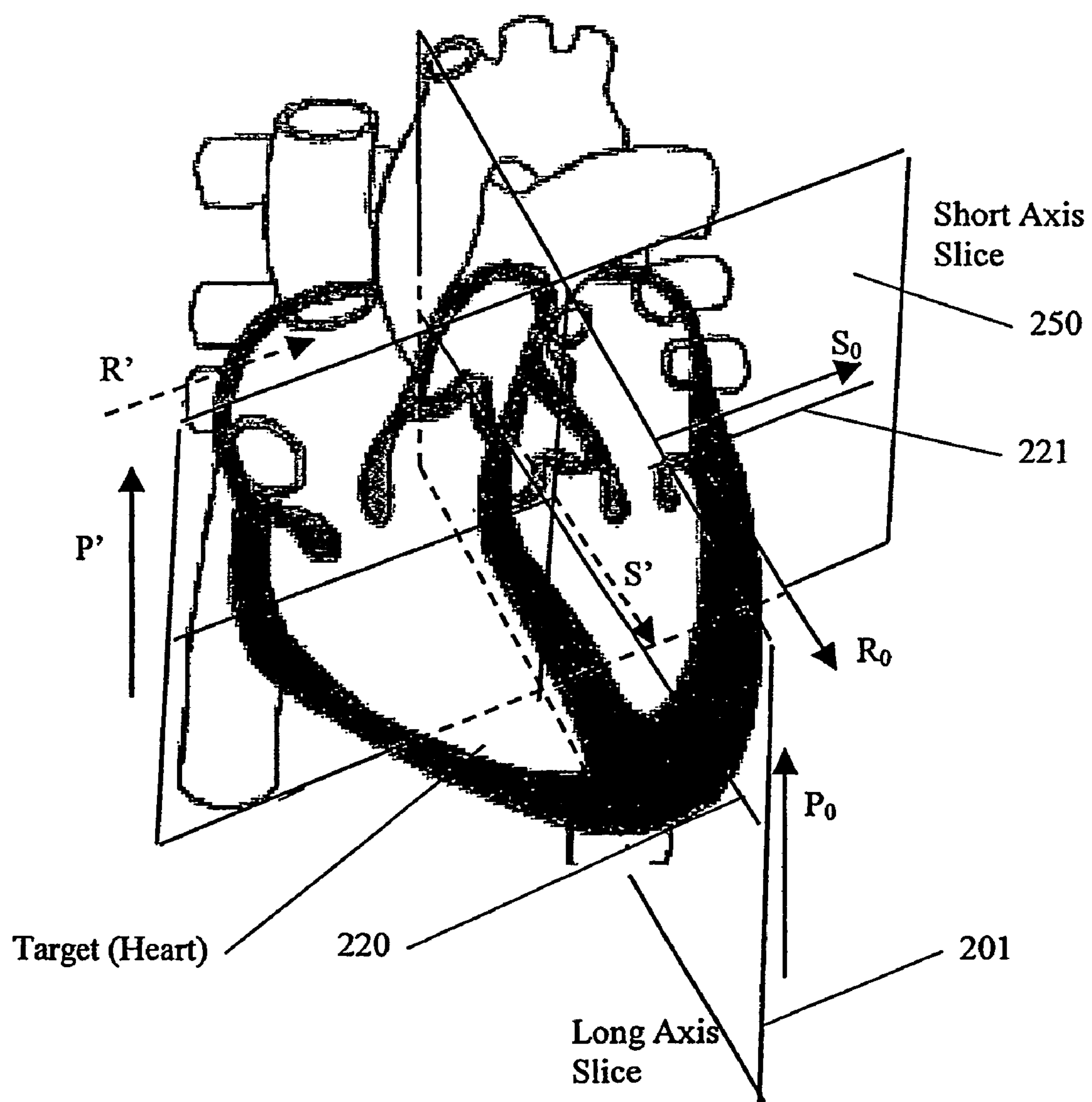
FIG. 1 shows a perspective view of a heart to be imaged, along with short-axis and long-axis planes which illustrates an exemplary interrelationship between a short-axis plane and a long-axis plane derived from the short-axis plane as applied according to an exemplary embodiment of the present invention.

FIG. 1 shows a perspective view of a heart to be imaged, along with short-axis and long-axis planes. This figure illustrates the interrelationship between the short-axis plane (also referred to as a "slice" or "slice plane") 250 containing a short axis 221 and a long-axis plane 201 containing a long axis 220. The long-axis plane 201 is derived from the short-axis plane 250. An image is acquired along the short-axis slice 250, and used to define the long-axis slice plane 201.

Figure 2:
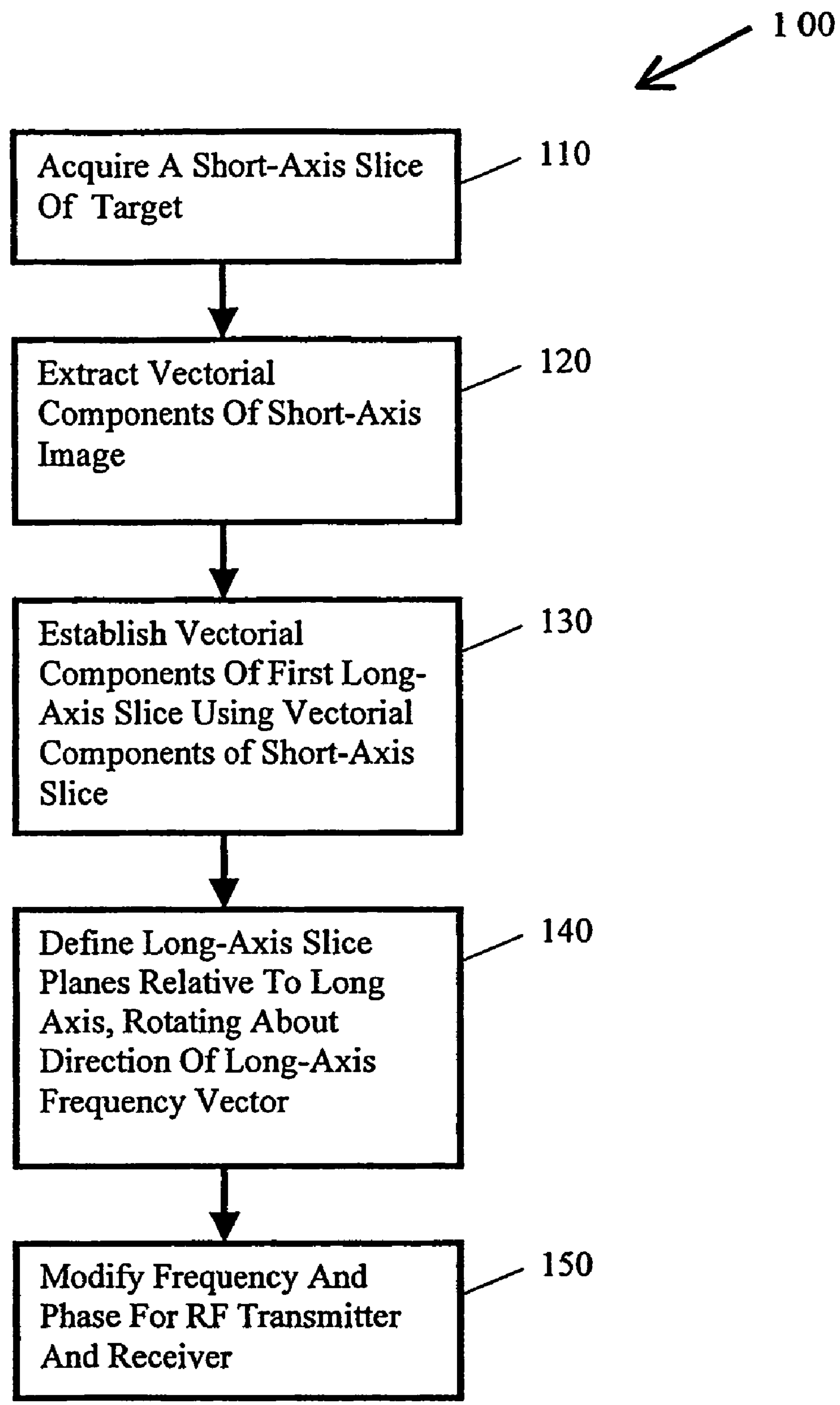
FIG. 2 shows a flow chart of one exemplary embodiment of a method of the present invention for automatically prescribing radial slice planes along a long-axis of a target, such as a patient's cardiac region.

FIG. 2 shows a flow chart of one exemplary embodiment of a method 100 according to the present invention for automatically prescribing radial slice planes along a long-axis of a target, such as a patient's cardiac region. An image along the short-axis slice 250 of the target region is acquired in step 110. Vectorial components for the short-axis slice 250 are extracted in step 120 from the short-axis slice image. It should be understood the the short-axis vectorial components obtained from the image coordinates, and can be stored in memory or another storage arrangement, preferably along with associated position information which can be used to subsequently acquire other images. For example, the "image" of the short axis that is displayed, and from which is chosen the location of the axis around which the subsequent long axis images are to be rotated, can itself stored in the memory of the MRI apparatus, and has associated with it a stored set of "header information" data that specifies its orientation and location in space. This position information may be used in the calculation of the long axis image locations. Vectorial components of the long-axis slice 201 can be established in step 130 using the extracted short-axis vectorial components. Additional long-axis slice planes (e.g., 202-208 shown in FIG. 5) can be defined in step 140 relative to the long-axis plane 201, rotating about the long axis 220 in a direction of the long-axis frequency vector. The frequency and phase of an RF transmitter and RF receiver of an MRI apparatus can be modified in step 150 to accommodate the long-axis slice planes (e.g., 202-208 shown in FIG. 5).

Figure 3:
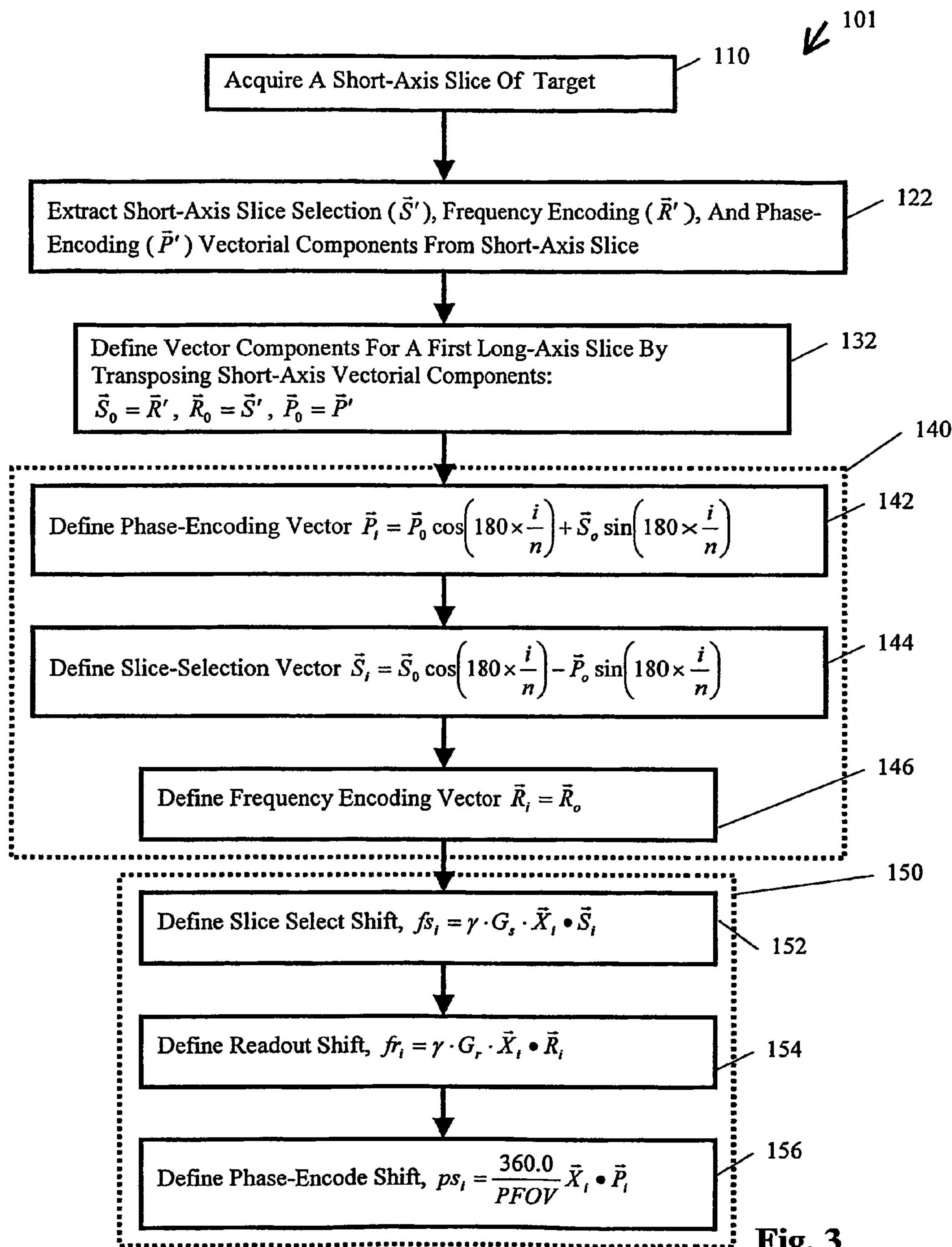
FIG. 3 shows further details a flow chart of another exemplary embodiment of the method of the present invention for automatically prescribing the radial slice planes along the long-axis of the target, such as the patient's cardiac region, which is shown in FIG. 2.

FIG. 3 shows a detailed illustration of a flow chart of the exemplary embodiment of the method 101 for automatically prescribing radial slice planes along the long axis 220 of the target, such as a patient's cardiac region, that includes many of the steps described above with respect to FIG. 2 in greater detail as described above, the image along the short-axis slice 250 of the target region is acquired in step 110. The short-axis slice 250 may include vectors $\vec{P}'$, $\vec{R}'$, and $\vec{S}'$ that represent the PE, RO and SS vectors for the short-axis image, as illustrated in the exemplary embodiment shown in FIG. 1. The short-axis slice vectors $\vec{P}'$, $\vec{R}'$, and $\vec{S}'$ are extracted in step 122 from the short-axis image.

These short-axis vectors can be used to define long-axis vectors. For example, the short-axis slice plane and frequency-encoding vectors may be transposed to define long-axis frequency-encoding ($\vec{R}_0$) and slice selection ($\vec{S}_0$) vectors, $$\vec{R}_0=\vec{S}' \text{ and } \vec{S}_0=\vec{R}',$$

and the long-axis phase-encoding vector ($\vec{P}_0$) is set equal to the short-axis PE vector $\vec{P}_0=\vec{P}'$. The orientation of the long-axis vectorial components is illustrated in the embodiment of FIG. 1. It should be understood that the choice of the long-axis PE vector to lie along the short-axis PE vector as cited in this exemplary figure is only one of many arbitrary choices that could be made. For another orientation of the long axis mage, it may lie in another direction within the original short-axis image, according to the intersection of the new long-axis image with the short-axis image.

Having established the vector components for the first slice 201 in the long-axis direction, the next step 140 is preformed to define the multiple slice planes (e.g., 202-208 shown in FIG. 5) in the long axis direction, such that the long-axis slice planes rotate about the long axis 220 in the frequency-encoding direction, and are spaced at substantially equal angles. If n planes are to be prescribed, then the vector $\vec{P}_i$ for the $i^{th}$ plane may be defined in step 142 as $$\vec{P}_1=\vec{P}_0\cos\left(180\times\frac{i}{n}\right)+\vec{S}_o\sin\left(180\times\frac{i}{n}\right).$$

If n planes are to be prescribed, then the vector $\vec{S}_t$ for the $i^{th}$ plane is defined in step 144 as $$\vec{S}_i=\vec{S}_0\cos\left(180\times\frac{i}{n}\right)+\vec{P}_o\sin\left(180\times\frac{i}{n}\right).$$

The frequency-encoding vector $\vec{R}_t$ can be defined in step 146 as the frequency encoding vector for the first long-axis slice, $\vec{R}_t=\vec{R}_o$. The result of application of the exemplary method according to the present invention is a plurality of n defined long-axis planes spaced apart by equal angles about the long axis 220.

Having developed the orientation of the long-axis slices, frequency and phase modifications can be generated in step 150 e.g., to ensure identical position vectors for each of the long-axis the slices. In the exemplary embodiment of the method the flow chart of which is shown in FIG. 3, the frequency and phase can be modified by calculating and applying a slice-select frequency shift ($fs_i$), a readout frequency shift ($fr_t$), and a phase shift ($ps_t$). If $\vec{X}_o$ is the position vector of the long-axis slice 201, then the position vector for the $i^{th}$ long-axis slice plane may be defined as the position vector of the long-axis slice 201: $\vec{X}_t=\vec{X}_o$. The frequency and phase shifts may be calculated using amplitudes of the slice-select and readout gradients $G_s$, $G_r$, respectively, and using the phase field-of-view (PFOV) and the gyromagnetic ratio γ (in MHz/T). The frequency shift for the slice-select, $fs_t$, direction for the $i^{th}$ slice is calculated in step 152 as $$fs_t=\gamma\cdot G_s\cdot\vec{X}_i\cdot\vec{S}_i.$$

The frequency shift for the readout, $fr_i$, direction for the $i^{th}$ slice may be calculated in step 154 as $$fr_i=\gamma\cdot G_r\cdot\vec{X}_i\cdot\vec{R}_i.$$

The phase shift $ps_i$ in the phase-encode direction is calculated 156 as $$ps_i=\frac{360.0}{PFOV}\vec{X}_i\cdot\vec{P}_i.$$

For example, a frequency shift may be applied to the transmitted RF pulse during slice-selective excitation to ensure that the location of the long-axis slice will lie at the desired location along the slice-select gradient $S_0$. The phase-encoding gradient $P_0$ may be applied after excitation but prior to signal detection; the orientation of the phase-encoding gradient is chosen to be within the plane of the excited long-axis slice and perpendicular to the long axis of the heart (or other desired object to be imaged) itself. The frequency encoding or readout gradient $R_0$ can be applied during the detection of the signal; it is chosen to be perpendicular to both the other gradients (and thus along the axis of the heart). Phase shifts can be employed during the image acquisition or afterward, during image processing, to shift the effective location of the image within the image plane, if desired.

Figure 4:
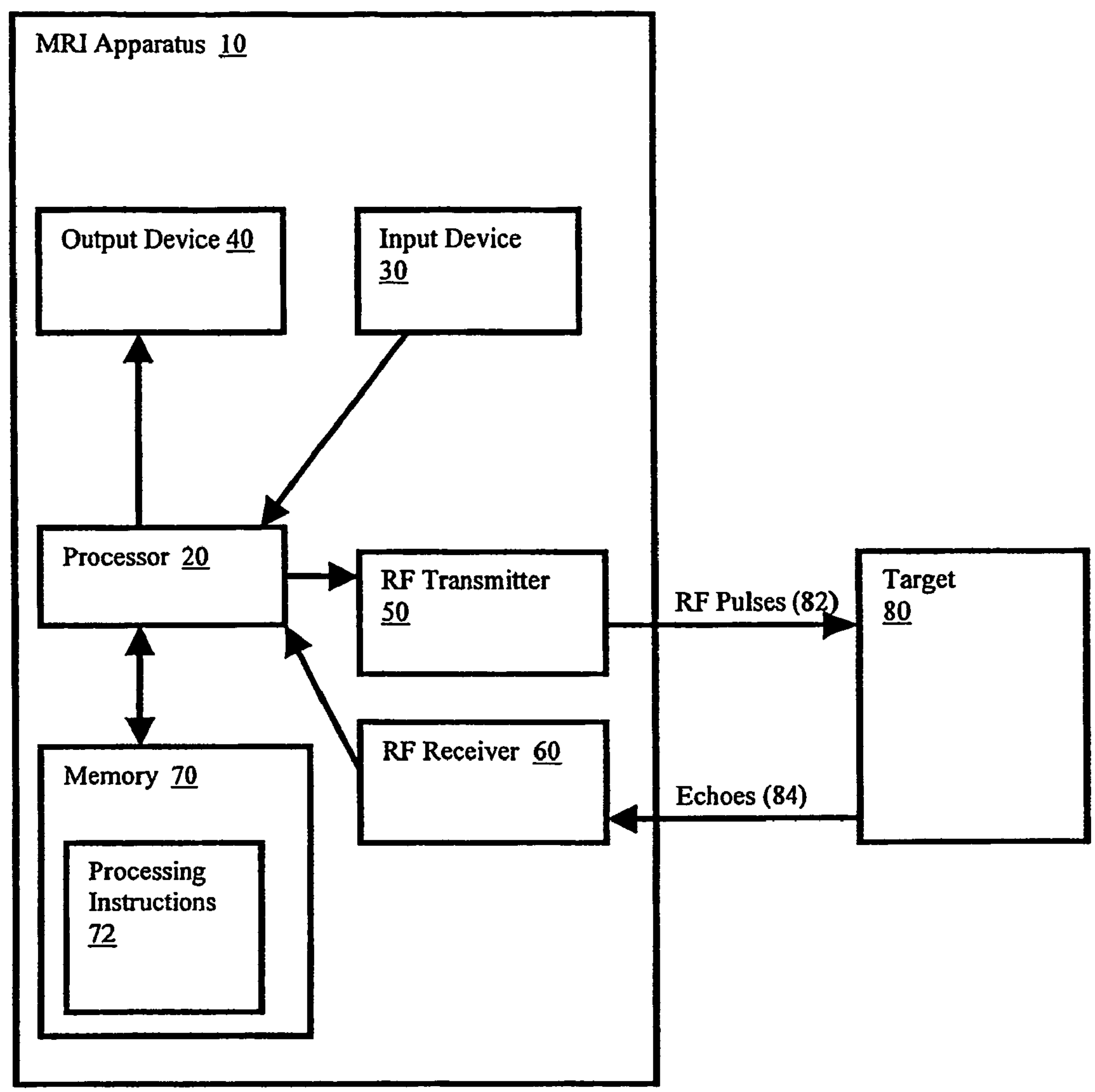
FIG. 4 shows an exemplary embodiment of an MRI apparatus which may be used to implement the method illustrated in FIGS. 2 and 3.

FIG. 4 shows an exemplary embodiment of an MRI apparatus 10 which may be used to implement the exemplary method 100 or 101 described above with respect to FIGS. 2 and 3. A radio frequency ("RF") pulse 82 is transmitted in step 110 by an RF transmitter 50 of the MRI apparatus 10 toward a target 80. In one exemplary embodiment, the method 100 or 101 applies to cardiac MRI techniques and the target 80 is a patient's cardiac region. The RF pulse 80 generates an echo 84 from the target 80, which is received 120 by an RF receiver 60 of the MRI apparatus 10. In one exemplary embodiment, a single device—a transceiver—is used as both an RF receiver 60 and an RF transmitter 50.

For example, the received echo 84 is processed by the processor 20 of the MRI apparatus 10 using instructions 72 stored in a storage device 70 (e.g., memory). The processor 20 can extract data from the received echo 84. The data may be stored by the MRI apparatus 10, for example, in the storage device 70. The MRI apparatus 10 may be operated, for example, using the input device 30 to control the processor 20. Results from the processing may be displayed or otherwise output using the output device 40 (e.g., a display).

Figure 5:
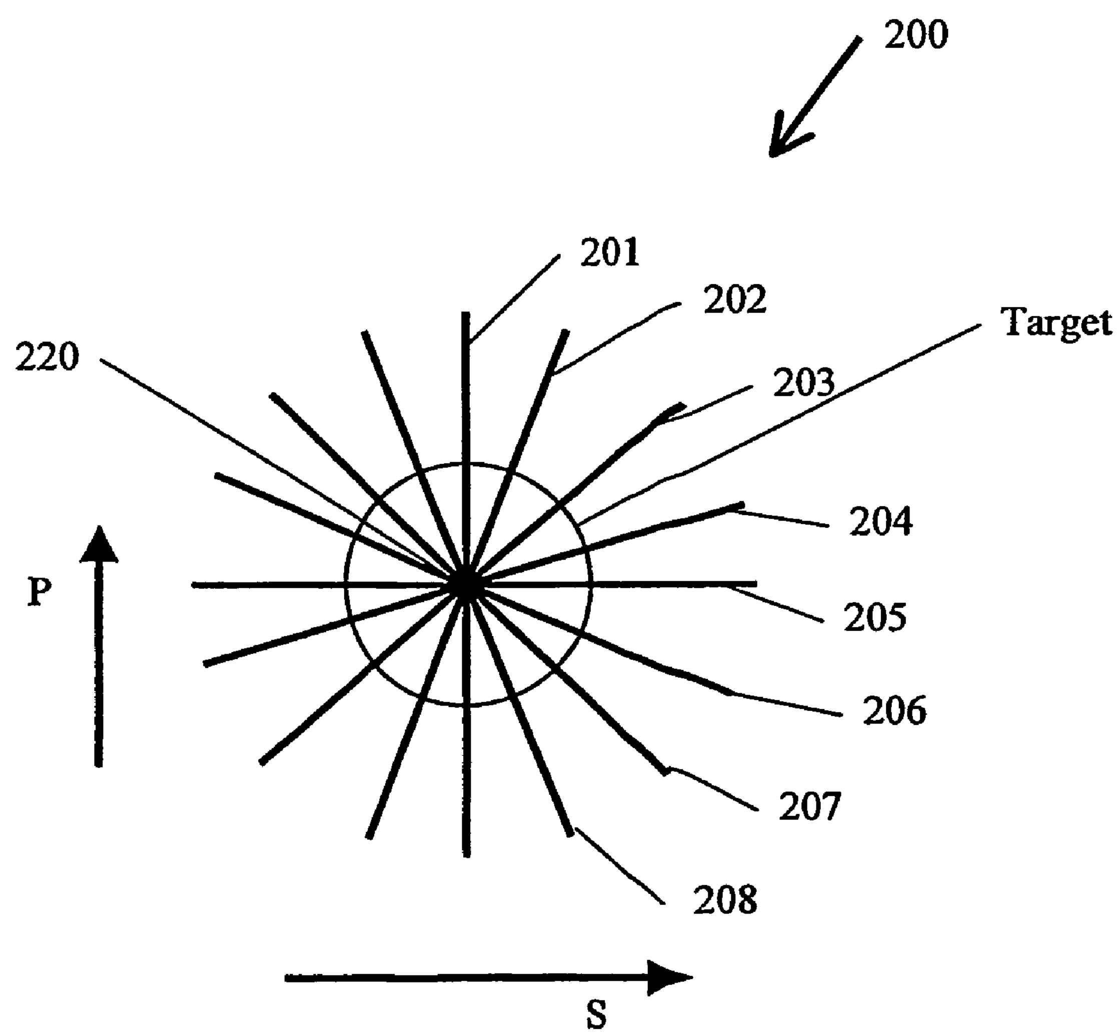
FIG. 5 shows exemplary eight (8) long-axis slices of the target, such as the cardiac region of the patient, prescribed according to an exemplary method of the present invention.

FIG. 5 shows eight (8) exemplary long-axis slices 201-208 of the target, such as the cardiac region of a patient, prescribed according to the exemplary embodiments of the methods of the present invention. The long-axis slice 201 can be defined using vectors of a short-axis slice, such as the slice shown in FIG. 1. The other long-axis slices 202-208 may be defined about the long axis 220, spaced at substantially equal angles from each other, as shown in FIG. 5.

Although the present invention has been described with respect to particular embodiments thereof, variations are possible. The present invention may be embodied in specific forms without departing from the essential spirit or attributes thereof. For example, although the present invention is illustrated in connection with MRI techniques using magnetization tagging datasets, and using MRI of the cardiac region, one skilled in the art will recognize that the present invention is applicable to any MRI study in which it is desirable to prescribe radial long-axis slices of a target.

In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, CD-ROMS, a carrier wave from the Internet or other network, or other forms of random access memory ("RAM") or read-only memory ("ROM"). It is desired that the embodiments described herein be considered in all respects illustrative and not restrictive and that reference be made to the appended claims and their equivalents for determining the scope of the present invention.

The invention claimed is:

1. A method of automatically prescribing radial slice planes for magnetic resonance imaging ("MRI") along a long-axis of a target, comprising:

acquiring vectorial components for a short-axis slice of the target;

establishing vectorial components for a long-axis slice using the vectorial components of the short-axis slice;

defining a plurality of long-axis slice planes positioned relative to the long axis slice, each of the slices being rotated about a long axis in a direction of a long-axis frequency encoding vector; and modifying an RF transmitter and receiver frequency and phase to accommodate the defined long-axis slices.

2. The method of claim 1, further comprising obtaining a short-axis image along the short-axis slice, wherein the obtaining step comprises extracting the vectorial components from the short-axis image.

3. The method of claim 1, wherein the acquiring step comprises acquiring a slice selection vector, a phase encoding vector, and a frequency encoding vector for the short-axis slice.

4. The method of claim 1, wherein the establishing step comprises transposing the short-axis vectorial components.

5. The method of claim 1, wherein the establishing step long-axis vectorial components comprises transposing frequency encoding and slice selection components of the short-axis slices.

6. The method of claim 1, wherein the establishing step includes determining long-axis vectorial components by:

defining a long-axis frequency encoding vector ($\vec{R}_0$) as a short-axis slice selection vector ($\vec{R}_0=\vec{S}'$);

defining a long-axis slice selection vector ($\vec{S}_0$) as a short-axis frequency encoding vector ($\vec{S}_0=\vec{R}'$); and defining a long-axis phase-encoding vector ($\vec{P}_0$) as a short-axis phase-encoding vector($\vec{P}_0=\vec{P}'$).

7. The method of claim 1, wherein the defining step comprises defining a plurality of long-axis slice-planes rotating about a frequency-encoding direction.

8. The method of claim 1, wherein the defining step comprises:

defining a phase-encoding vector ($\vec{P}_i$) for each (i) of the plurality (n) of long-axis slice planes as $$\vec{P}_1=\vec{P}_0\cos\left(180\times\frac{i}{n}\right)+\vec{S}_o\sin\left(180\times\frac{i}{n}\right);$$

defining a slice-selection vector ($\vec{S}_i$) for each (i) of the plurality (n) of long-axis slice planes as $$\vec{S}_i=\vec{S}_0\cos\left(180\times\frac{i}{n}\right)+\vec{P}_o\sin\left(180\times\frac{i}{n}\right);\ \text{and}$$

defining a frequency encoding vector ($\vec{R}_i$) for each (i) of the plurality (n) of long-axis slice planes as $\vec{R}_i=\vec{R}_0$.

9. The method of claim 1, wherein the modifying step comprises applying frequency and phase shifts to signals associated with each of the plurality of long-axis planes.

10. A method of automatically prescribing radial slice planes for magnetic resonance imaging ("MRI") along a long-axis of a target, comprising:

acquiring vectorial components for a short-axis slice of the target;

establishing vectorial components for a long-axis slice using the vectorial components of the short-axis slice;

defining a plurality of long-axis slice planes positioned relative to the long axis slice, each of the slices being rotated about a long axis in a direction of a long-axis frequency encoding vector; and modifying an RF transmitter and receiver frequency by a slice select shift ($fs_i$) for each (i) long-axis plane, wherein the slice select shift is defined by $fs_i=\gamma\cdot G_s\cdot\vec{X}_i\cdot\vec{S}_i$, wherein $G_s$ is a slice-select gradient amplitude, and $\gamma$ is a gyromagnetic ratio.

11. A method of automatically prescribing radial slice planes for magnetic resonance imaging ("MRI") along a long-axis of a target, comprising:

acquiring vectorial components for a short-axis slice of the target;

establishing vectorial components for a long-axis slice using the vectorial components of the short-axis slice;

defining a plurality of long-axis slice planes positioned relative to the long axis slice, each of the slices being rotated about a long axis in a direction of a long-axis frequency encoding vector; and modifying an RF transmitter and receiver frequency by a readout shift ($fr_i$) for each (i) long-axis plane, wherein the readout shift is defined by $fr_i=\gamma\cdot G_r\cdot\vec{X}_i\cdot\vec{R}_i$, wherein $G_r$ is a readout gradient amplitude.

12. A method of automatically prescribing radial slice planes for magnetic resonance imaging ("MRI") alone a long-axis of a target, comprising:

acquiring vectorial components for a short-axis slice of the target;

establishing vectorial components for a long-axis slice using the vectorial components of the short-axis slice;

defining a plurality of long-axis slice planes positioned relative to the long axis slice, each of the slices being rotated about a long axis in a direction of a long-axis frequency encoding vector; and modifying the phase-encode direction for each (i) long-axis plane, wherein the phase-encode shift ($ps_i$) is defined by $$ps_i=\frac{360.0}{PFOV}\vec{X}_i\cdot\vec{P}_i,$$

wherein PFOV is a phase field-of-view and $\vec{X}_i$ is a position vector for the $i^{th}$ long-axis slice plane.

13. A magnetic resonance imaging ("MRI") apparatus, comprising:

a processor that is capable of executing instructions to automatically prescribe a radial along a long-axis of a target, wherein the processor is capable of:

establishing vectorial components for a long-axis slice of a target using vectorial components of a short-axis slice of the target, defining a plurality of long-axis slice planes positioned relative to the long-axis slice, each of the slices being rotated about a long axis in a direction of a long-axis frequency encoding vector, and determining a frequency shift for the long-axis slices;

an RF transmitter in communication with the processor, wherein the transmitter forwards an RF pulse toward the target in response to a signal provided by the processor to obtain an image at each of the plurality of long-axis slice planes; and an RF receiver in communication with the processor, wherein the RF receiver is capable of receiving data from echoes generated by the pulses, and transmits the data to the processor.

14. The apparatus of claim 13, wherein the processor controls the RF pulse generated by the RF transmitter using the frequency shift.

15. The apparatus of claim 13, wherein the processor processes data received by the RF receiver using the frequency shift.

16. The apparatus of claim 13, wherein the a frequency shift is calculated by calculating a slice selection frequency shift and a readout frequency shift for each of the plurality of long-axis slice planes.

17. The apparatus of claim 13, wherein the phase shift is calculated for each of the long-axis planes.

18. A computer-readable medium having stored thereon computer-executable instructions for automatically prescribing radial slice planes for magnetic resonance imaging ("MRI") along a long-axis of a target, wherein the instructions configure a processor arrangement to perform the steps comprising:

establishing vectorial components for a long-axis slice using vectorial components for a short-axis slice of the target;

defining a plurality of long-axis slice planes positioned relative to the long axis slice, each of the long-axis slices rotating about a long axis in a direction of a long-axis frequency encoding vector, and being positioned at substantially equal angles relative to adjacent slices; and modifying an RF transmitter and receiver frequency and phase to accommodate the defined long-axis slices.

19. The medium of claim 18, wherein vectorial components are the established by:

establishing slice selection and frequency-encoding vectorial components for the long-axis slice by transposing slice selection and frequency-encoding vectorial components of the short-axis slice; and establishing a phase-encoding vectorial component of the long-axis slice as the phase-encoding vectorial component of the short-axis slice.

20. A computer-readable medium of having stored thereon computer-executable instructions for automatically prescribing radial slice planes for magnetic resonance imaging ("MRI") along a long-axis of a target, wherein the instructions configure a processor arrangement to perform the steps comprising:

establishing vectorial components for a long-axis slice using vectorial components for a short-axis slice of the target;

defining a plurality of long-axis slice planes positioned relative to the lone axis slice, each of the long-axis slices rotating about a long axis in a direction of a long-axis frequency encoding vector, and being positioned at substantially equal angles relative to adjacent slices; and calculating a readout frequency shift, a slice selection frequency shift, and a phase shift for each of the long-axis slice planes.

21. A software arrangement, which when executed by a processing arrangement is capable of automatically prescribing radial slice planes for magnetic resonance imaging ("MRI") along a long-axis of a target, comprising:

a first set of instructions which configure the processing arrangement to establish vectorial components for a long-axis slice using vectorial components for a short-axis slice of the target; and a second set of instructions which configure the processing arrangement to define a plurality of long-axis slice planes positioned relative to the long axis slice, each of the long-axis slices rotating about a long axis in a direction of a long-axis frequency encoding vector, and being positioned at substantially equal angles relative to adjacent slices; and a third set of instruction which configure the processing arrangement to modify an RF transmitter and receiver frequency and phase to accommodate the defined long-axis slices.

22. A magnetic resonance imaging ("MRI") apparatus, comprising:

a processor that is capable of executing instructions to automatically prescribe a radial along a long-axis of a target, wherein the processor is capable of:

establishing vectorial components for a long-axis slice using vectorial components for a short-axis slice of the target;

defining a plurality of long-axis slice planes positioned relative to the long axis slice, each of the long-axis slices rotating about the long axis in a direction of a long-axis frequency encoding vector, and being positioned at substantially equal angles relative to adjacent slices; and modifying an RF transmitter and receiver frequency and phase to accommodate the defined long-axis slices.

23. A magnetic resonance imaging ("MRI") apparatus, comprising:

a processor that is capable of executing instructions to automatically prescribe a radial along a long-axis of a target, wherein the processor is capable of:

establishing vectorial components for a long-axis slice using vectorial components for a short-axis slice of the target;

defining a plurality of long-axis slice planes positioned relative to the long axis slice, each of the long-axis slices rotating about the long axis in a direction of a long-axis frequency encoding vector, and being positioned at substantially equal angles relative to adjacent slices; and calculating a readout frequency shift, a slice selection frequency shift, and a phase shift for each of the long-axis slice planes.

24. A magnetic resonance imaging ("MRI") apparatus, comprising:

a processor that is capable of executing instructions to automatically prescribe a radial along a long-axis of a target, wherein the processor is capable of:

establishing vectorial components for a long-axis slice using vectorial components for a short-axis slice of the target;

defining a plurality of long-axis slice planes positioned relative to the long axis slice, each of the long-axis slices rotating about the long axis in a direction of a long-axis frequency encoding vector, and being positioned at substantially equal angles relative to adjacent slices; and modifying an RF transmitter and receiver frequency by at least one of:

i. a slice select shift ($fs_i$) for each (i) long-axis plane, wherein the slice select shift is defined by $fs_i=\gamma \cdot G_s \cdot \vec{X}_i \cdot \vec{S}_i$, wherein $G_s$ is a slice-select gradient amplitude, and $\gamma$ is a gyromagnetic ratio, or ii. a readout shift ($fr_i$) for each (i) long-axis plane, wherein the readout shift is defined by $fr_i=\gamma \cdot G_r \cdot \vec{X}_i \cdot \vec{R}_i$, wherein $G_r$ is a readout gradient amplitude.

25. A magnetic resonance imaging ("MRI") apparatus, comprising:

a processor that is capable of executing instructions to automatically prescribe a radial along a long-axis of a target, wherein the processor is capable of:

establishing vectorial components for a long-axis slice using vectorial components for a short-axis slice of the target;

defining a plurality of long-axis slice planes positioned relative to the long axis slice, each of the long-axis slices rotating about the long axis in a direction of a long-axis frequency encoding vector, and being positioned at substantially equal angles relative to adjacent slices; and modifying the phase-encode direction for each (i) long-axis plane, wherein the phase-encode shift ($ps_i$) is defined by $$ps_i = \frac{360.0}{PFOV}\vec{X}_i \cdot \vec{P}_i,$$

wherein PFOV is a phase field-of-view and $\vec{X}_i$ is a position vector for the $i_{th}$ long-axis slice plane.

26. A computer-readable medium having stored thereon computer-executable instructions for automatically prescribing radial slice planes for magnetic resonance imaging ("MRI") along a long-axis of a target, wherein the instructions configure a processor arrangement to perform the steps comprising:

establishing vectorial components for a long-axis slice using vectorial components for a short-axis slice of the target;

defining a plurality of long-axis slice planes positioned relative to the long axis slice, each of the long-axis slices rotating about a long axis in a direction of a long-axis frequency encoding vector, and being positioned at substantially equal angles relative to adjacent slices; and modifying an RF transmitter and receiver frequency by at least one of:

i. a slice select shift ($fs_i$) for each (i) long-axis plane, wherein the slice select shift is defined by $fs_i = \gamma \cdot G_s \cdot \vec{X}_i \cdot \vec{S}_i$, wherein $G_s$ is a slice-select gradient amplitude, and $\gamma$ is a gyromagnetic ratio, or ii. a readout shift ($fr_i$) for each (i) long-axis plane, wherein the readout shift is defined by $fr_i = \gamma \cdot G_r \cdot \vec{X}_i \cdot \vec{R}_i$ wherein $G_r$ is a readout gradient amplitude.

27. A computer-readable medium having stored thereon computer-executable instructions for automatically prescribing radial slice planes for magnetic resonance imaging ("MRI") along a long-axis of a target, wherein the instructions configure a processor arrangement to perform the steps comprising:

establishing vectorial components for a long-axis slice using vectorial components for a short-axis slice of the target;

defining a plurality of long-axis slice planes positioned relative to the long axis slice, each of the long-axis slices rotating about a long axis in a direction of a long-axis frequency encoding vector, and being positioned at substantially equal angles relative to adjacent slices; and modifying the phase-encode direction for each (i) long-axis plane, wherein the phase-encode shift ($ps_i$) is defined by $$ps_i = \frac{360.0}{PFOV}\vec{X}_i \cdot \vec{P}_i,$$

wherein PFOV is a phase field-of-view and $\vec{X}_i$ is a position vector for the $i^{th}$ long-axis slice plane.

28. A software arrangement, which when executed by a processing arrangement is capable of automatically prescribing radial slice planes for magnetic resonance imaging ("MRI") along a long-axis of a target, comprising:

a first set of instructions which configure the processing arrangement to establish vectorial components for a long-axis slice using vectorial components for a short-axis slice of the target;

a second set of instructions which configure the processing arrangement to define a plurality of long-axis slice planes positioned relative to the long axis slice, each of the long-axis slices rotating about a long axis in a direction of a long-axis frequency encoding vector, and being positioned at substantially equal angles relative to adjacent slices; and a third set of instruction which configure the processing arrangement to calculate a readout frequency shift, a slice selection frequency shift, and a phase shift for each of the long-axis slice planes.

29. A software arrangement, which when executed by a processing arrangement is capable of automatically prescribing radial slice planes for magnetic resonance imaging ("MRI") along a long-axis of a target, comprising:

a first set of instructions which configure the processing arrangement to establish vectorial components for a long-axis slice using vectorial components for a short-axis slice of the target;

a second set of instructions which configure the processing arrangement to define a plurality of long-axis slice planes positioned relative to the long axis slice, each of the long-axis slices rotating about a long axis in a direction of a long-axis frequency encoding vector, and being positioned at substantially equal angles relative to adjacent slices; and a third set of instruction which configure the processing arrangement to modify an RF transmitter and receiver frequency by at least one of:

i. a slice select shift ($fs_i$) for each (i) long-axis plane, wherein the slice select shift is defined by $fs_i = \gamma \cdot G_s \cdot \vec{X}_i \cdot \vec{S}_i$, wherein $G_s$ is a slice-select gradient amplitude, and $\gamma$ is a gyromagnetic ratio, or ii. a readout shift ($fr_i$) for each (i) long-axis plane, wherein the readout shift is defined by $fr_i = \gamma \cdot G_r \cdot \vec{X}i \cdot \vec{R}_i$, wherein $G_r$ is a readout gradient amplitude.

30. A software arrangement, which when executed by a processing arrangement is capable of automatically prescribing radial slice planes for magnetic resonance imaging ("MRI") along a long-axis of a target, comprising:

a first set of instructions which configure the processing arrangement to establish vectorial components for a long-axis slice using vectorial components for a short-axis slice of the target;

a second set of instructions which configure the processing arrangement to define a plurality of long-axis slice planes positioned relative to the long axis slice, each of the long-axis slices rotating about a long axis in a direction of a long-axis frequency encoding vector, and being positioned at substantially equal angles relative to adjacent slices; and a third set of instruction which configure the processing arrangement to modify the phase-encode direction for each (i) long-axis plane, wherein the phase-encode shift ($ps_i$) is defined by $$ps_i = \frac{360.0}{PFOV}\vec{X}_i \cdot \vec{P}_i,$$

wherein PFOV is a phase field-of-view and $\vec{X}_i$ is a position vector for the $i^{th}$ long-axis slice plane.

31. A method of automatically prescribing radial slice planes for magnetic resonance imaging ("MRI") along a long-axis of a target, comprising:

acquiring vectorial components for a short-axis slice of the target;

establishing vectorial components for a long-axis slice using the vectorial components of the short-axis slice;

defining a plurality of long-axis slice planes positioned relative to the long axis slice, each of the slices being rotated about a long axis in a direction of a long-axis frequency encoding vector; and calculating a readout frequency shift, a slice selection frequency shift, and a phase shift for each of the long-axis slice planes.

32. A computer-readable medium having stored thereon computer-executable instructions for automatically prescribing radial slice planes for magnetic resonance imaging ("MRI") along a long-axis of a target, wherein the instructions configure a processor arrangement to perform the steps comprising:

establishing vectorial components for a long-axis slice of a target using vectorial components of a short-axis slice of the target, defining a plurality of long-axis slice planes positioned relative to the long-axis slice, each of the slices being rotated about a long axis in a direction of a long-axis frequency encoding vector, and determining a frequency shift for the long-axis slices;

providing a signal to an RF transmitter in communication with the processor arrangement to forward RF pulses toward the target to obtain an image at each of the plurality of long-axis slice planes; and receiving data from an RF receiver in communication with the processor arrangement associated with echoes generated by the RF pulses.

* * * * *